United States Patent [19]

Tokumaru et al.

[11] 4,151,019
[45] Apr. 24, 1979

[54] METHOD OF MANUFACTURING INTEGRATED INJECTION LOGIC SEMICONDUCTOR DEVICES UTILIZING SELF-ALIGNED DOUBLE-DIFFUSION TECHNIQUES

[75] Inventors: Yukuya Tokumaru; Masanori Nakai; Satoshi Shinozaki; Junichi Nakamura; Shintaro Ito; Yoshio Nishi, all of Yokohama, Japan

[73] Assignee: Tokyo Shibaura Electric Co., Ltd., Tokyo, Japan

[21] Appl. No.: 822,322

[22] Filed: Aug. 5, 1977

Related U.S. Application Data

[62] Division of Ser. No. 644,294, Dec. 24, 1975, Pat. No. 4,058,419.

[30] Foreign Application Priority Data

Dec. 27, 1974 [JP] Japan ............................... 49-148795
Dec. 27, 1974 [JP] Japan ............................... 49-148796
Dec. 27, 1974 [JP] Japan ............................... 49-148797
Dec. 27, 1974 [JP] Japan ............................... 49-191375

[51] Int. Cl.² ..................... H01L 21/22; H01L 21/76; H01L 27/04
[52] U.S. Cl. ................... 148/175; 29/576 E; 29/576 W; 29/578; 148/187; 148/188; 357/35; 357/36; 357/44; 357/46; 357/92
[58] Field of Search ............ 148/175, 187, 188; 357/35, 36, 44, 46, 92; 29/576-578

[56] References Cited

U.S. PATENT DOCUMENTS

| 3,472,710 | 10/1969 | Welty ........................... 148/187 X |
| 3,560,278 | 2/1971 | Sanera ............................ 148/187 |
| 3,837,936 | 9/1974 | Kraft ............................ 148/187 |
| 3,922,565 | 11/1975 | Berger et al. ................. 357/44 X |
| 3,928,081 | 12/1975 | Marley et al. ............... 148/187 X |
| 3,982,266 | 9/1976 | Matzen et al. ................ 357/92 X |
| 4,005,470 | 1/1977 | Tucci et al. ................... 357/92 X |
| 4,009,057 | 2/1977 | Brebisson et al. ............. 148/187 X |
| 4,021,270 | 5/1977 | Hunt et al. ................... 148/187 X |

OTHER PUBLICATIONS

Carlsen, S. S., "Multiple Diffusion–Single Diffusion", I.B.M. Tech. Discl. Bull., vol. 9, No. 10, Mar. 1967, pp. 1456-1458.

Primary Examiner—R. Dean
Assistant Examiner—W. G. Saba
Attorney, Agent, or Firm—Finnegan, Henderson, Farabow & Garrett

[57] ABSTRACT

A P type semiconductor layer is formed on an N type semiconductor layer by vapor epitaxial growth technique, an insulating film is formed on the P type semiconductor layer and a grid shape first opening is provided through the insulating film. Then, phosphorus is diffused into the P type semiconductor layer through the grid shape opening to form a first N type region extending through the semiconductor layer to reach the N type semiconductor layer. Then, second openings are formed through respective sections of the insulating film divided by and surrounded by the grid shape first opening and boron is diffused through the first and second openings to form first and second P type regions in the grid shape first N type region and the P type semiconductor layer, respectively. Finally, third openings are formed through respective portions of the insulating film and phosphorus is diffused into the P type semiconductor layer through the third openings to form second N type regions thereby forming an integrated injection logic semiconductor device including a lateral PNP transistor and a vertical NPN transistor.

7 Claims, 41 Drawing Figures

METHOD OF MANUFACTURING INTEGRATED INJECTION LOGIC SEMICONDUCTOR DEVICES UTILIZING SELF-ALIGNED DOUBLE-DIFFUSION TECHNIQUES

This is a division of application Ser. No. 644,294, filed Dec. 24, 1975 and now issued as U.S. Pat. No. 4,058,419.

This invention relates to a method of manufacturing an integrated injection logic semiconductor device.

While a logic circuit such as a transistor-transistor logic circuit (TTL) has been well known, an integrated injection logic semiconductor circuit (IIL or I²L) has become noted in recent years because its construction is simpler, it can be manufactured at higher yields and can be more densely integrated than the transistor-transistor logic circuit. This type of the circuit is also called an MTL and comprises a switching transistor or vertical transistor formed on a semiconductor substrate and a lateral transistor also formed on the substrate for injecting minority carriers into the base region of the switching transistor. Thus, while the minority carriers are injected into the base region of the switching transistor, the input to the I²L circuit or the input to the base region of the switching transistor is controlled, thereby to efficiently control the output from the I²L circuit, that is, the collector output of the switching transistor.

In the prior art integrated injection logic semiconductor device, an N conductivity type semiconductor layer is formed on a semiconductor substrate having any conductivity type by vapour epitaxial growth technique, and a P type impurity, for example, boron is diffused into the N conductivity type semiconductor layer at a concentration of above $10^{17}$ to $10^{19}$ atoms/cm³ to form first and second P type regions. Then, an N type impurity, for example, phosphorus is diffused into the first P type region at a concentration of $10^{18}$ to $10^{21}$ atoms/cm³ to form an N type region. The I²L circuit constructed as above described comprises a lateral PNP transistor having emitter, base and collector respectively constituted by the second P type region, the N type semiconductor layer and the first P type region, and a vertical NPN transistor having emitter, base and collector respectively constituted by the N type semiconductor layer, the first P type region and the N type region.

When a forward voltage is impressed across the PN junction between the second P type region and the N type semiconductor layer of the I²L circuit holes are injected into the first P type region from the second P type region through the N type semiconductor layer. At this time, when a binary "1" input signal is applied to the input of the I²L circuit, that is, the base region (the first P type region) of the vertical transistor, the emitter current supplied from the emitter region (the second P type region) of the base grounded lateral PNP transistor is multiplied by the current amplification factor $\alpha_{PNP}$ thereof and the amplified emitter current flows to the first P type region serving not only as the collector of the lateral PNP transistor but also as the base region of the vertical NPN transistor. As a result, this vertical NPN transistor is turned ON thus providing a binary "0" signal at the output thereof, or the collector region (N type region). This collector output current is permitted to have at maximum a value equal to the product of the base current of the vertical NPN transistor and the current amplification factor $\beta_{NPN}$ thereof. On the other hand, when a binary "0" signal is applied to the input, the emitter current flows out from the input instead of providing the base current of the vertical NPN transistor. Accordingly, the vertical NPN transistor is turned OFF thus producing a binary "1" signal on its output.

The power consumption of the I²L semiconductor device is greatly influenced by the characteristics of the lateral PNP transistor, in other words, by the current amplification factor $\alpha_{PNP}$ of the lateral PNP transistor with its base grounded, and as the amplification factor $\alpha_{PNP}$ approaches a value of 1, the power consumption decreases. Further, the values of the fan out, noise margin, etc. are greatly influenced by the characteristics of the vertical NPN transistor, especially the current amplification factor $\beta_{NPN}$ of the vertical NPN transistor with its emitter grounded. For this reason, in the I²L semiconductor device, it is necessary to simultaneously increase the current amplification factors $\alpha_{PNP}$ and $\beta_{NPN}$ of both transistors.

In such prior art semiconductor device although it is relatively easy to decrease the recombination of the charge carriers in the base region by suitably selecting the impurity concentration in the emitter and base regions of the lateral PNP transistor, the width of the base region is determined by the accuracy of the mask utilized in photoetching technique, and thus limited to a value of from 5 to 10 microns at portions near the mask.

Moreover as the emitter region and the collector region are formed by diffusing a P type impurity into the N type semiconductor layer at two portions of the surface of the N type semiconductor layer, the base region formed between these two diffused regions has a tendency of increasing the width thereof in the direction of depth with the result that the carrier transport efficiency decreases with the depth. Further, as the emitter diffusion region is hemispherical, the impurity concentration gradient at the emitter-base junction surface is gentle, thus decreasing the carrier injection efficiency. For this reason, it is difficult to improve the current amplification factor $\alpha_{PNP}$ of the lateral PNP transistor. On the other hand, dually diffused regions (the N type region, and the first P type region) and the N type semiconductor layer are used to constitute the vertical NPN transistor and as the N type semiconductor layer is used as the emitter, it is obliged to decrease its impurity concentration than the first P type region utilized as the base. Moreover, a deceleration electric field is applied to the carriers injected from the N type semiconductor layer. These greatly limit the improvement of the current amplification factor $\beta_{NPN}$ of the vertical NPN transistor. Moreover, as the base of the lateral PNP transistor and the emitter of the vertical NPN transistor utilize a common region (N type semiconductor layer) and the collector of the lateral PNP transistor and the base of the vertical NPN transistor utilize a common region (the first P type region), where the impurity concentrations in the emitter and base regions are selected to appropriate values for the purpose of improving the carrier transport efficiency and the carrier injection efficiency of one transistor, the carrier injection efficiency and the carrier transport efficiency of the other transistor would be decreased. As a consequence, it is impossible to improve simultaneously the current amplification factors of both transistors. Accordingly, an improved I²L semiconductor device free from these disadvantages has been desired in the art, and the applicant has already invented improved I²L semiconductor devices as disclosed in Japanese Patent applications No. 14856/74 and 1909/75.

The improved I²L semiconductor devices disclosed in these applications comprise an N type semiconductor substrate, a P type semiconductor layer overlying the N type semiconductor substrate, a first N type region extending through the P type semiconductor layer to reach the N type semiconductor substrate, a first P type region formed in the first N type region by diffusion, a second N type region formed in the P type semiconductor layer and a second P type region formed in the P type semiconductor layer, said first P type region, the first N type region and the P type semiconductor layer constituting a lateral PNP transistor, and the N type semiconductor substrate, the P type semiconductor layer and the second N type region constituting a vertical NPN type transistor.

In this I²L semiconductor device, the emitter region of the lateral transistor is formed along the periphery of the base region so that the base width has a uniform thickness whereby the transport efficiency of the carriers in the base region is improved. Further, as the impurity concentration of the base region of the vertical NPN transistor is extremely lower than that of the emitter region, it is possible to improve not only the injection efficiency of the carriers in the base region from the emitter region but also the transport efficiency of the carriers in the base region.

It is an object of this invention to provide a method of manufacturing an integrated injection logic semiconductor device of the improved type just described.

Another object of this invention to provide a novel method capable of manufacturing an integrated injection logic semiconductor device having a low power delay product, a high layout and a large noise margin.

According to this invention there is provided a method of manufacturing an integrated injection logic semiconductor device comprising the steps of forming a semiconductor layer of the opposite conductivity type on a semiconductor substrate of one conductivity type; forming an insulating film on the semiconductor layer of the opposite conductivity type; forming a first opening through the insulating film; doping an impurity of the one conductivity type into the semiconductor layer of the opposite conductivity type through the first opening thereby forming a first one conductivity type region which reaches the semiconductor substrate of the one conductivity type; forming a second opening through the insulating film; doping an impurity of the opposite conductivity type into the first one conductivity type region and the semiconductor layer of the opposite conductivity type respectively through the first and second openings thereby forming first and second opposite conductivity type regions in the first one conductivity type region and the semiconductor layer of the opposite conductivity type respectively; forming a third opening through the insulating film; and doping an impurity of the one conductivity type into the semiconductor layer of the opposite conductivity type through the third opening thereby forming a second one conductivity type region in the semiconductor layer of the opposite conductivity type.

According to another embodiment of this invention the first and second openings or the first to third openings are formed concurrently thereby simplifying the process steps by eliminating the necessity of aligning a mask.

This invention can be more fully understood from the following detailed description when taken in conjunction with the accompanying drawings, in which.

Figure 1A:
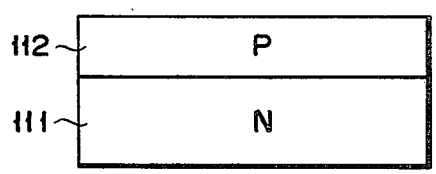
FIGS. 1A through 1H are sectional views showing various steps of manufacturing an integrated injection logic semiconductor device provided with a first opening for forming a first N type region and a first P type region, a second opening for forming a second P type region and a third opening for forming a second N type region.
Figure 1E:
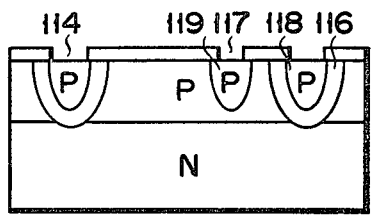
Figure 1B:
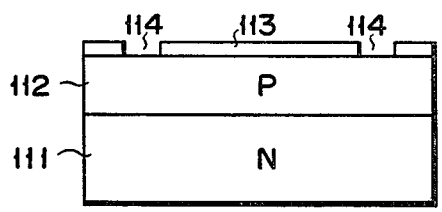
Figure 1F:
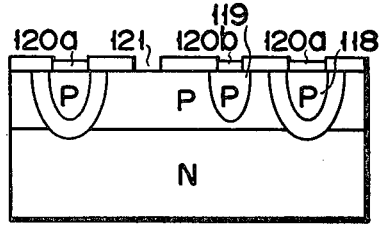
Figure 1C:
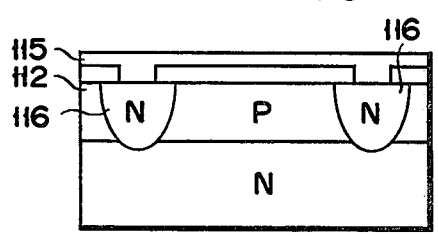
Figure 1G:
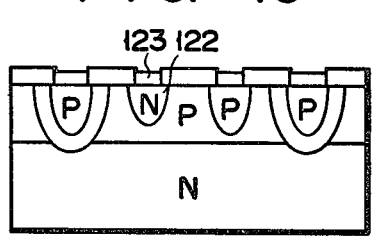
Figure 1D:
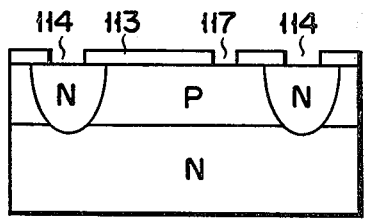
Figure 1H:
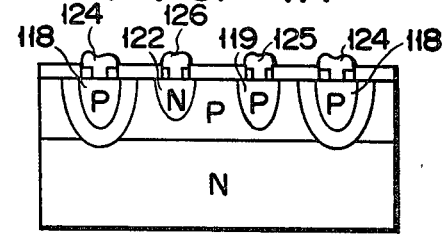

As shown in FIG. 1A, at first a P type semiconductor layer 112 containing boron at a concentration of $10^{15}$ to $10^{17}$ atoms/cm³ is formed by vapour epitaxial growth technique on an N type semiconductor substrate 111 having a resistivity of from 0.01 to 10 ohm/cm and a thickness of from 400 to 500 microns and prepared by incorporating by diffusion or ion implantation technique a donor impurity, for example phosphorus, antimony or arsenic, into a silicon wafer. Alternatively, the semiconductor layer 112 may be formed by reducing silicon tetrachloride with hydrogen at an elevated temperature of 1100° C., for example. Then, as shown in FIG. 1B, an insulation film or oxide film 113 is formed on the surface of the P type semiconductor layer 112 and first openings 114 are selectively formed through the oxide film 113 by photoetching technique. Then a silicon oxide layer 115 incorporated with a donor impurity, for example phosphorus, is formed by low temperature vapour epitaxial growth technique to cover the portions of the P type semiconductor layer 112 exposed by the openings 114 and the oxide film 113. In carrying out the vapour growth technique, the oxide layer 115 is formed on the semiconductor portions and the film 113 with the ratio of mixing a silane, and oxygen suitably selected correspondingly to the desired impurity concentration and a temperature selected from about 400° to 500° C. Then the semiconductor assembly provided with the silicon oxide layer 115 is left standstill for from about 30 minutes to two hours in a high temperature nonoxidizing atmosphere maintained at a temperature, for example, of from 1000° to 1100° C., and containing nonoxidizing gas such as nitrogen thereby to form first N type diffused regions 116 immediately below the first openings 114 and extending through the P type semiconductor layer 112 to reach the N conductivity type substrate 111. Thereafter, in the step shown in FIG. 1D, the silicon oxide layer 115 is removed by an etching solution containing hydrofluoric acid, nitric acid and water at a ratio of 4:1:90 to expose the oxide layer 113 and the surface of the first N type regions 116 through the openings 114. The junction edges of the first N type regions 116 extend in the horizontal direction to an extent about 80% of the depths of the regions. Then, second openings 117 are selectively formed through the oxide film 113 between the openings 114 by photoetching technique. Then, as shown in FIG. 1E, boron, for example boron trioxide, is diffused into the first N type regions and the P type semiconductor layer 112 through first and second openings 114 and 117 at a diffusion temperature of from 1000° to 1040° C. to form first and second P type regions 118 and 119 respectively in the first N type region 116 and the P type semiconductor layer 112. After forming the first and second P type regions 118 and 119, as shown in FIG. 1F, silicon oxide films 120a and 120b are formed on the portions of the surfaces of the first and second P type regions 118 and 119 which are exposed in the openings 114 and 117 by effecting thermal diffusion in an oxidizing atmosphere. Thereafter, a thrid opening 121 is formed through the other portion of the oxide film 113 between the openings 114 by photoetching technique. Then, phosphorus in the form of phosphorus pentaoxide is diffused through openings 121 into the P type semiconductor layer 112 in an oxidizing atmosphere maintained at a temperature of from about 900° to 1000° C. to form a second N type region 122 as shown in FIG. 1G. Again, the exposed surfaces of the second N type regions 122 are covered by silicon oxide films 123. Then openings are formed respectively through the silicon oxide films 120a, 120b and 123 on the first and second P type regions 118 and 119 and the second N type regions 122, and electrode forming metal suitable for electrode, for example aluminum, is vacuum deposited on the exposed surfaces of the regions 118, 119 and 122 through the openings to a thickness of several microns thereby forming electrodes 124, 125 and 126 for regions 118, 119 and 122 respectively, as shown in FIG. 1H. A grounding terminal, not shown, is formed on the N type semiconductor substrate 111.

The I²L semiconductor circuit fabricated in a manner described above comprises a lateral PNP transistor having emitter, base and collector respectively constituted by the first P type region 118, the first N type region 116 and the P type semiconductor layer 112 and a vertical NPN transistor including emitter, base and collector respectively constituted by the N type semiconductor substrate 111, the P type semiconductor layer 112 and the second N type region 122. The second P type region acts as the ohmic contact region for the P type semiconductor layer 112.

Figure 2A:
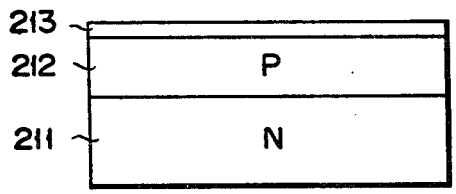
FIGS. 2A through 2L are sectional views showing various steps of a modified method of manufacturing an integrated injection logic semiconductor device in which first and second openings are simultaneously formed.
Figure 2E:
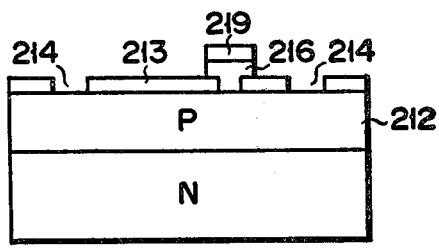
Figure 2B:
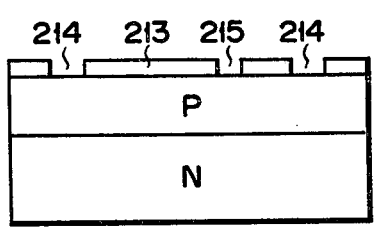
Figure 2F:
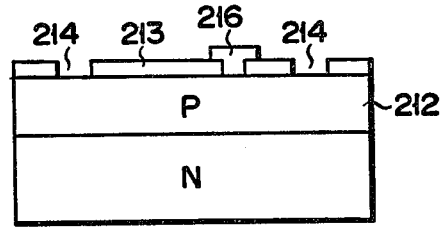
Figure 2C:
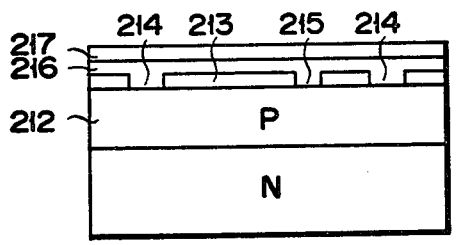
Figure 2G:
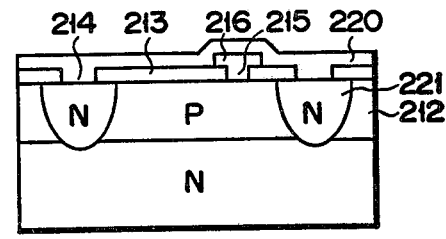
Figure 2D:
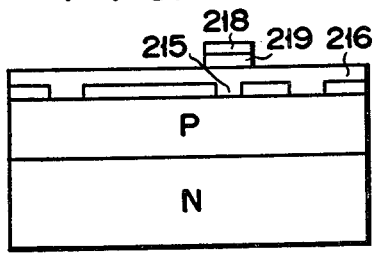
Figure 2H:
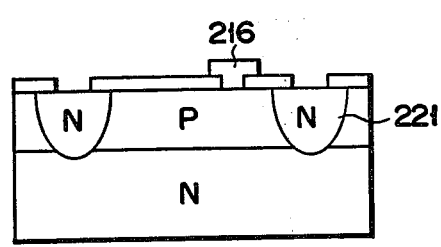
Figure 2I:
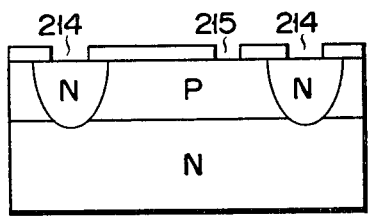
Figure 2J:
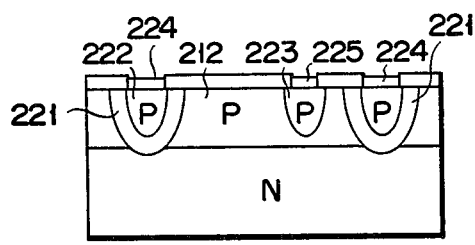
Figure 2K:
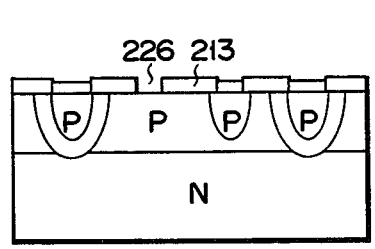
Figure 2L:
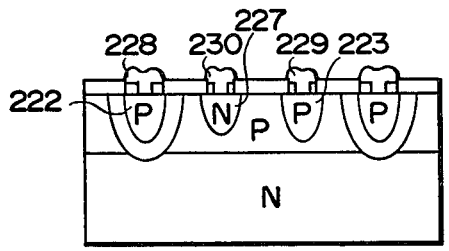

A method according to another embodiment of this invention will be described with reference to FIGS. 2A through 2L. At first, as shown in FIG. 2A, a P type semiconductor layer 212 containing an acceptor impurity, for example, boron at a concentration of from $10^{15}$ to $10^{17}$ atoms/cm³ and having a thickness of 3 to 5 microns is formed by vapour epitaxial growth technique on an N type substrate 211 containing an N type impurity (donor impurity), for example, phosphorus, antimony or arsenic, and having a resistivity of from 0.01 to 10 ohm-cm and a thickness of from 400 to 500 microns. Alternatively, the P type semiconductor layer 212 may be formed by reducing silicon tetrachloride by hydrogen at an elevated temperature of, for example, 1100° C. Then, the P type semiconductor layer 212 is subjected to a high temperature oxidizing atmosphere maintained at a temperature of from 1000° C. to 1100° C. to form an insulation film or oxide film 213 on the surface of the layer 212. Then as shown in FIG. 2B, first and second openings 214 and 215 are formed through the oxide film 213, and a silicon nitride film 216 is deposited on the surface of the oxide film 213 and on the surface portions of the P type semiconductor layer 212 which are exposed through openings 214 and 215, as shown in FIG. 2C. The film 216 is formed by vapour epitaxial growth technique wherein a silane and nitrogen are caused to react with each other at a temperature between 700° and 800° C. Then, a silicon oxide film 217 incorporated with phosphorus, is formed on the silicon nitride film 216 by low temperature vapour epitaxial growth technique. The silicon oxide film is formed from a suitable mixture of a silane, and oxygen at a temperature of from about 400° C. to 500° C. Then, the density of the film 217 is increased for the purpose of eliminating pin holes by heating the film in an oxidizing or non-oxidizing atmosphere maintained at a temperature of about 800° C. Then, as shown in FIG. 2D, a photoresist film 218 is applied to a portion of the silicon oxide film 217 immediately above the second opening 215 and the portion of the silicon oxide film 217 other than the portion thereof covered by the photoresist film 218 is removed by an etching solution containing hydrofluoric acid, nitric acid and water at a ratio of 4:1:90. Thereafter, the photoresist film 218 is removed and the exposed portion of the silicon nitride film 216 which is not covered by the remaining silicon oxide film 219 is removed by phosphoric acid of 80° C. thereby exposing again the first openings 214 as shown in FIG. 2E. Then, as shown in FIG. 2F, the remaining silicon oxide film 219 is removed by an etching solution of the type described above to expose the silicon nitride film 216. The oxide film 23, however, is not affected by the etching solution so that first openings 214 are maintained in the original condition. Then, as shown in FIG. 2G, a silicon oxide film 220 incorporated with phosphorus is formed by low temperature vapour epitaxial growth technique to cover the exposed portion of the P type semiconductor layer 12, the oxide film 213 and the silicon nitride film 216. The silicon oxide film 220 may be formed by the same method as that utilized to form the silicon oxide film 217 shown in FIG. 2C. The phosphorus contained in the silicon oxide film 220 is diffused into the P type semiconductor layer 212 in a nonoxidizing atmosphere containing nonoxidizing gas, for example nitrogen, and maintained at a temperature of about 1100° C. for forming first N type regions 221 in the P type semiconductor layer 212. The impurity concentration, film thickness and diffusion time of the silicon oxide film containing phosphorus are so selected to be $10^{18}$ to $10^{20}$ atoms/cm³, 300 Å to 500 Å and 30 minutes-2 hours, respectively, that the first N type regions 221 will reach the N type semiconductor substrate 211. After forming the first N type regions the silicon oxide film 220 is removed by an etching solution of the type described above as shown in FIG. 2H and then the silicon nitride films 216 in the second openings 215 are removed by phosphoric acid to expose again the second opening 215. Then boron is diffused into the first N type regions 221 and the semiconductor layer 212 through exposed first and second openings 214 and 215 in an oxidizing atmosphere maintained at a temperature of from 1000° C. to 1050° C. thereby forming first and second P type regions in the first N type regions 221 and the semiconductor layer 212, respectively, as shown in FIG. 2J. By this process step the first and second openings 214 and 215 are closed by the oxide films 224 and 225, respectively. Then as shown in FIg. 2K a third opening 226 is selectively formed through the other portion of the oxide film 213, and phosphorus in the form of phosphorus pentaoxide is diffused into the semiconductor layer 212 through the third opening as shown in FIG. 2L in an oxidizing atmosphere maintained at a temperature of from 980° C. to 1000° C. thereby forming a second N type region 227 in the semiconductor layer 212. At this time, the third opening 226 is closed by an oxide film. Thereafter, openings (not shown) are provided through the oxide film at the portions thereof overlying the first P type region 222, the second P type region and the second N type region 227, respectively and a metal suitable for electrode for example, aluminum is vapour deposited on the regions 222, 223 and 227 to form electrodes 228, 229 and 230 therefor.

According to this embodiment, since first and second openings 214 and 215 are formed simultaneously by a single photoetching step it is not necessary to use a precise mask for forming the openings as in the previous embodiment thus making easy to fabricate the I²L semiconductor device.

Still another embodiment of the method of this invention will now be described with reference to FIGS. 3A through 3L.

Figure 3A:
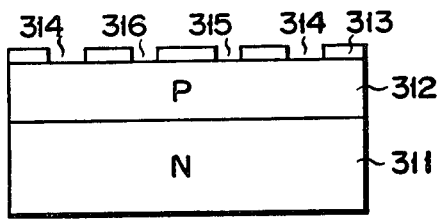
FIGS. 3A through 3L are sectional views showing various steps of method of manufacturing an I²L semiconductor device according to another embodiment in which first to third openings are formed simultaneously.
Figure 3B:
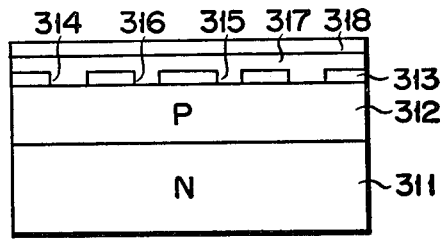
Figure 3C:
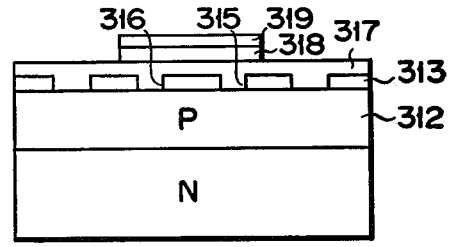
Figure 3D:
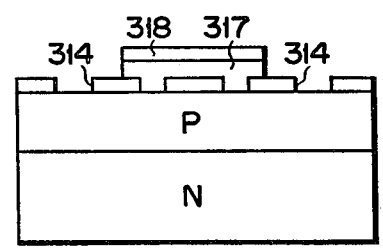
Figure 3E:
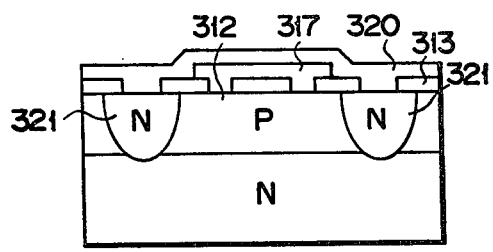
Figure 3I:
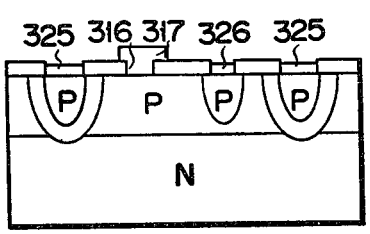
Figure 3F:
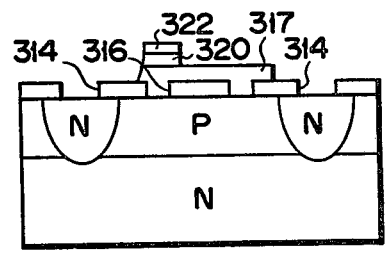
Figure 3J:
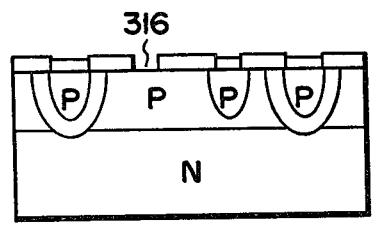
Figure 3G:
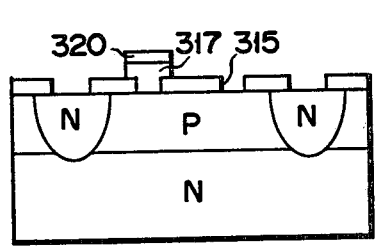
Figure 3K:
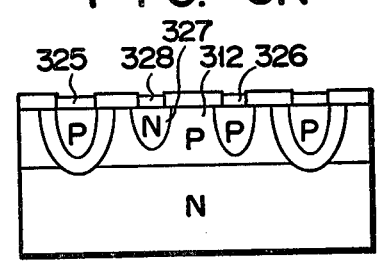
Figure 3H:
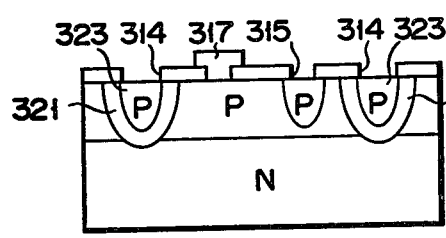
Figure 3L:
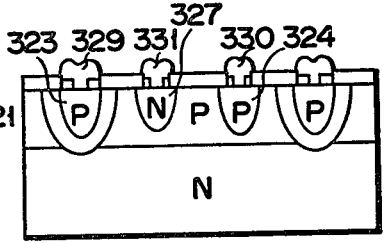

As shown in FIG. 3A, a P type semiconductor layer 312 containing boron at a concentration of from $10^{15}$ to $10^{17}$ atoms/cm³ and having a thickness of 3 to 5 microns is formed by vapour epitaxial growth technique on an N type substrate 311 containing a donor impurity such as phosphorus, antimony, or arsenic and having a resistivity of from 0.01 to 10 ohm-cm and a thickness of from 400 to 500 microns. Alternatively, the P type semiconductor layer 312 may be formed reducing silicon tetrachloride by hydrogen at an elevated temperature of, for example, 1100° C. Then the P type semiconductor layer 312 is subjected to an oxidizing atmosphere maintained at a temperature of from 1000° to 1100° C. to form an insulation film or oxide film 313 on the surface of the semiconductor layer 312. Then first, second and third openings 314, 315 and 316 are formed through the oxide film 313 by conventional photoetching technique utilizing a photoresist film. As shown in FIG. 3B, a silicon nitride film 317 is formed to cover the oxide film 313 as well as the portions of the surface of the P type semiconductor layer 312 which are exposed by the openings 314, 315 and 316. This silicon nitride film 317 can be formed by vapour epitaxial growth technique in which a silane and nitrogen are caused to react each other at a temperature of from 700° C. to 800° C. Then, the silicon nitride film 317 is covered by a silicon oxide film 318 and formed by low temperature vapour epitaxial growth technique. This film 318 is formed by vapour growth technique by using a gaseous mixture containing a silane and oxygen at a suitable ratio determined in accordance with the desired impurity concentration. Further, the silicon oxide film is heated to a temperature of about 800° C. in an oxidizing or non-oxidizing atmosphere to increase its density and to eliminate pin holes therein. As shown in FIG. 3C, a photoresist film 319 is formed on the portions of the silicon oxide film 318 above the second and third openings 315 and 316, and the portions of the silicon oxide film 318 other than the portions thereof covered by the photoresist film 319 are removed by a hydrofluoric acid-nitric acid etching solution containing hydrofluoric acid, nitric acid and water at a ratio of 4:1:90. Thereafter, photoresist film 319 is removed, and the exposed portions of the silicon nitride film 317 not covered by the remaining silicon oxide film 318 are removed by phosphoric acid solution of 80° C. to expose again the first openings 314 as shown in FIG. 3D. A silicon oxide film 320 incorporated with phosphorus is formed by low temperature vapour epitaxial growth technique to cover the exposed surface portion of the P type semiconductor layer 312, oxide film 313 and silicon nitride film 317 as shown in FIG. 3E. This silicon oxide film 320 may be formed by the same method utilized to form silicon oxide film 318 shown in FIG. 3B. The silicon oxide film 318 remaining in the step shown in FIG. 3D may be removed or preserved. When treated in a non-oxidizing atmosphere containing non-oxidizing gas, for example, nitrogen and maintained at a temperature of 1100° C., the phosphorus contained in the silicon oxide film 320 is diffused into the P type semiconductor layer 312 to form first N type regions 321. The impurity concentration and the thickness of the silicon oxide film 320 containing phosphorus and diffusion time are so selected that the first N type region 321 reach the N type semiconductor substrate 311. Good results are obtained with, for example, an impurity concentration of from $10^{18}$ to $10^{20}$ atoms/cm³, film thickness of from 3000 to 5000 Å, and a diffusion time of from 30 minutes to 2 hours. After forming the first N type regions 321 a photoresist film 322 is applied to the portion of the surface of the silicon oxide film 320 immediately above a third opening as shown in FIG. 3F. The portions of the silicon oxide film 320 except those covered by the photoresist film 322 are removed by the hydrofluoric acid-nitric acid etching solution described above, thereby exposing again the first openings 314 and a portion of the silicon nitride film 317. Thereafter, as shown in FIG. 3G the exposed portion of the silicon nitride film 317 is removed by the phosphoric acid solution whereby the second openings 315 are exposed again. Then, boron is diffused into the first N type regions 321 and the P type semiconductor layer 312 through the first and second openings 314 and 315 in an oxidizing atmosphere maintained at a temperature of from 1000° to 1050° C. for forming first and second P type regions 323 and 324 in the first N type regions 321 and the P type semiconductor layer 312, respectively as shown in FIG. 3H. At this time, the first and second openings 314 and 315 are covered by oxide films 325 and 326 as shown in FIG. 3I. Thereafter, the silicon nitride film 317 remaining in the third opening 316 is removed by an etching solution to expose the third opening 316 as shown in FIG. 3J. At the step shown in FIG. 3K, phosphorus in the form of phosphorus pentaoxide in an oxidizing atmosphere maintained at a temperature of from 980° C. to 1000° C. is diffused into the P type semiconductor layer 312 through the third opening 316 to form the second N type region 327. At this time, the third opening 316 is closed by an oxide film 328. Finally, openings (not shown) are formed through oxide films 325, 326 and 328, respectively, on the first and second P type regions 323 and 324 and the second N type region, and metal suitable for electrode, for example, aluminum, is vapour deposited through these openings to provide electrodes 329, 330 and 331, each having a thickness of several microns, for regions 323, 324 and 327, respectively.

In this embodiment, since first, second and third openings are formed at the same time by a single photoetching process it is possible to further decrease the number of steps required to align masks utilized to form various openings. In addition, as it is possible to form these openings in more closely spaced relationship it is possible to improve the density of integrated circuits of the semiconductor device.

In the embodiments described above, it is possible to reverse the conductivity types of various elements. In other words, the substrate may be made of P type and the conductivity types of other regions and layer are reversed accordingly. The P type semiconductor layer may be formed by diffusion and the insulating film overlying the P type semiconductor layer may be a thermal oxide film, an oxide film formed by vapour epitaxial growth technique or a nitride film. The type of the film can be selected suitably by diffusion process. The first opening formed through the insulating film is used to form the first N type region and the first P type region. Thus, these two regions are formed by so-called self-alignment technique. The first N type region should be formed by a deep diffusion such that it penetrates through the P type semiconductor layer to reach the N type semiconductor substrate and also after the first N type region has been formed it is necessary to advance the etching for use without the necessity of aligning the mask with the first opening. Accordingly, the first N type region is formed by using a silicon oxide layer incorporated with phosphorus and formed by low temperature vapour epitaxial growth technique and the silicon oxide film is removed by an etching solution containing hydrofluoric acid, nitric acid and water at a ratio of 4:1:90 after the first N type region has been formed. By this method, it is possible to form the first N type region without affecting the insulating film. The first N type region can also be formed by injecting such donor impurity as phosphorus and arsenic in the P type semiconductor layer by ion implantation technique and activating the injected region by heating it at a temperature, for example, of from 900° C. to 1000° C. In this case, the first opening may be left open or closed by a silicon oxide film having a thickness of about from 500 Å and incorporated with phosphorus and formed by low temperature vapour epitaxial growth technique. Where the conductivity types of various regions and layer of the I²L semiconductor device are inverted, that is when the first N type region is replaced by a P type region, boron is injected into the semiconductor layer by ion implantation technique and the injected region is actuated by heating the assembly in a non-oxidizing atmosphere such as nitrogen for the purpose of forming the P type region. The thermal diffusion can be carried out by using a solid epitaxial source, for example, boron trioxide, a liquid epitaxial source, for example, boron tetrabromide, or a vapour epitaxial source, for example, boron trichloride. It is to be understood that such diffusion step should be made in a non-oxidizing atmosphere without closing the first opening.

As it is necessary to form the first P type region in the first N type region to have shallower diffused region than the first N type region it is advantageous to use boron having a relatively low diffusion coefficient as the impurity for forming the first P type region, when the first P type region is substituted for the N type region in an I²L semiconductor device of the inverted conductivity type, although it is preferable to use an impurity having a relatively low diffusion coefficient such as antimony or arsenic, phosphorus having a relatively high diffusion coefficient can also be used satisfactorily provided that it is diffused at a relatively low temperature. In this case, it is possible to form the region by thermal diffusion of a solid epitaxial source, a liquid epitaxial source or a vapour epitaxial source or by ion implantation technique.

Still another embodiment of the invention will be described hereunder with reference to FIGS. 4A through 4L.

Figure 4A:
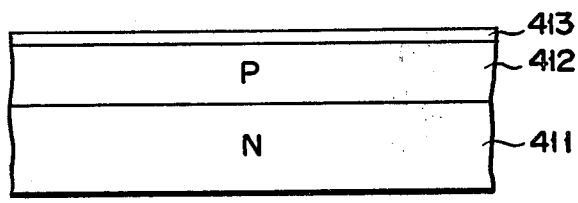
FIGS. 4A through 4H are sectional views showing various steps of manufacturing an I²L semiconductor device according to still another embodiment which does not rely upon self alignment technique.
Figure 4B:
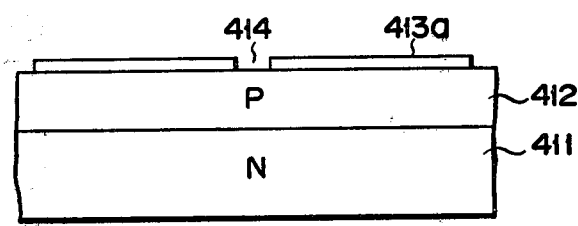
Figure 4C:
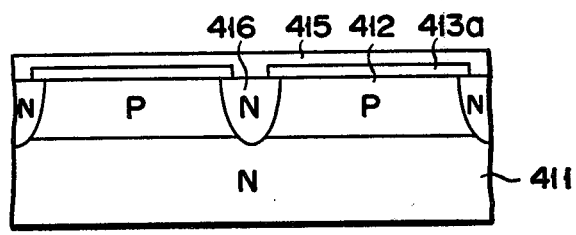

As shown in FIG. 4A, a P⁻ type or $\pi$ type semiconductor layer 412 having a low impurity concentration is formed on an N type semiconductor substrate or an N⁺ type semiconductor layer 411 having a high impurity concentration. For example, boron is used as the impurity for the layer 412 which is formed on the N type substrate 411 by vapour epitaxial growth technique to have an impurity concentration of from $10^{14}$ to $10^{16}$ atoms/cm³ and a thickness of 2 to 3 microns. An insulation film or silicon dioxide film or SiO₂ film 413 is formed on the semiconductor layer 412 in a high temperature oxidizing atmosphere. An opening 414 having a predetermined pattern, for example, grid shape, is formed through the SiO₂ film 413 as shown in FIG. 4B by photoetching technique. Thus, the SiO₂ film 413 is divided into a plurality of SiO₂ sections 413a by the grid shape opening 414. Then as shown in FIG. 4C, a doped oxide film 415 incorporated with a donor impurity, for example, phosphorus, is formed on the exposed surface of the semiconductor layer 412 and the SiO₂ sections 413a by low temperature vapour epitaxial growth technique at a temperature of about 500° C. Then, the assembly is heated to a temperature of 1100° C. in a non-oxidizing atmosphere to cause the phosphorus contained in the doped oxide film 415 to diffuse into the semiconductor layer 412 through the same to reach the N type semiconductor substrate 411, thereby to form a first N type region 416 having an impurity concentration of from $10^{16}$ to $10^{17}$ atoms/cm³ in the semiconductor layer 412.

Figure 4D:
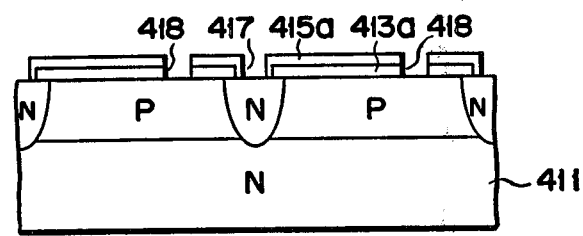
Figure 4E:
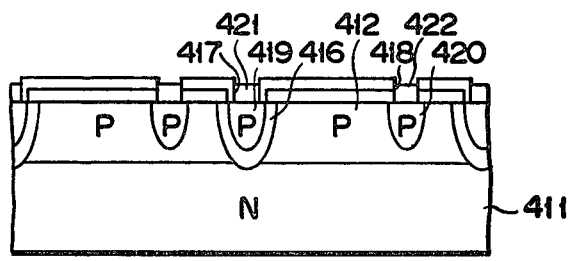
Figure 4F:
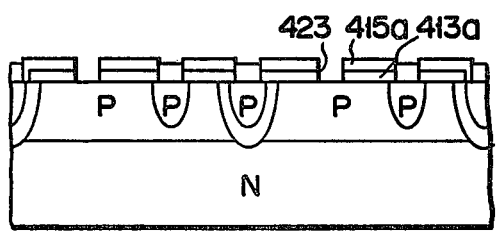
Figure 4G:
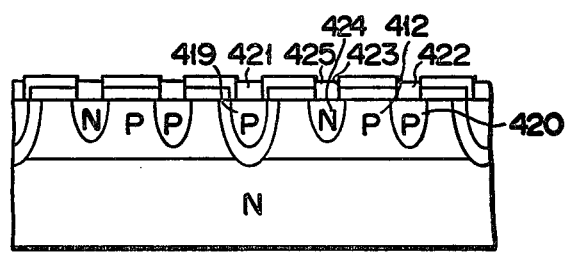
Figure 4H:
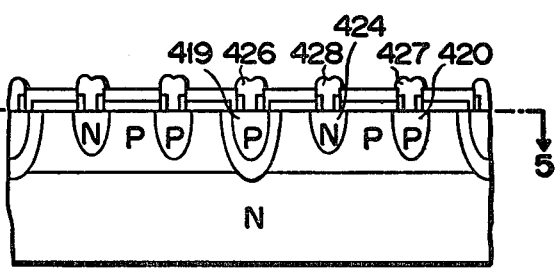
Figure 5:
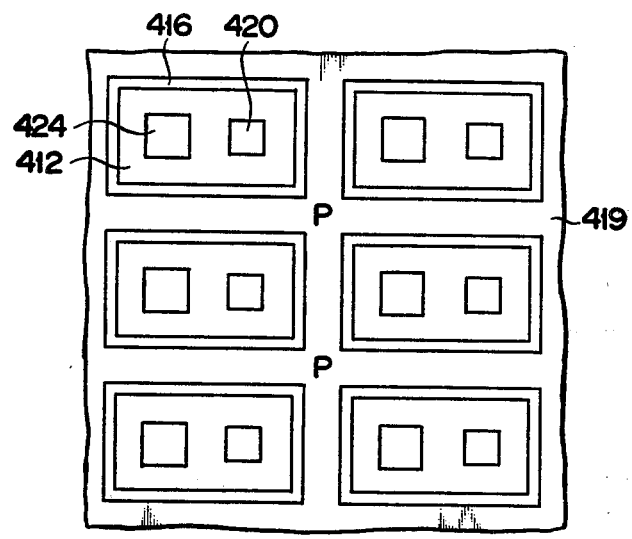
FIG. 5 shows a sectional view of the I²L semiconductor device shown in FIG. 4H taken along a line 5—5.

Then, as shown in FIG. 4D, a grid shape opening 417 having a configuration corresponding to that of the grid shape opening 414 is formed through the doped oxide film or SiO₂ film 415. At the same time, openings 418 are formed through respective SiO₂ sections 413a into which the SiO₂ film is divided by the opening 414 and through respective doped oxide films 415a overlying the portions 413a. Then, as shown in FIG. 4D, an acceptor impurity, for example, boron is diffused into the first N type region 416 and the semiconductor layer 412 through openings 417 and 418 in a high temperature oxidizing atmosphere maintained at a temperature of 1050° C. to form first and second P type regions 419 and 420, each having a depth of 1 to 2 microns, in the first P type region 416 and the semiconductor layer 412, respectively. At the same time, openings 417 and 418 are closed by oxide films 421 and 422 respectively. Then, as shown in FIG. 4G, another opening 423 is formed through respective SiO₂ sections 413a and the doped SiO₂ sections 415a, and a donor impurity, for example, phosphorus is diffused into the semiconductor layer 412 in a high temperature oxidizing atmosphere to form a second N type region 424. At the same time, the opening 423 is closed by a SiO₂ film 425. Thereafter, openings (not shown) are formed respectively through SiO₂ films 421, 422 and 425 covering the first P type region 419, the second P type region 420 and the second N type regions 424 respectively and electrodes 426, 427 and 428 are formed for the regions 419, 420 and 424 by vapour depositing aluminum, for example, through these openings.

The I²L semiconductor device manufactured by the method described above comprises a lateral transistor and a vertical transistor. The base region of the lateral transistor has a uniform width throughout its depth and is extremely narrow and an appropriate impurity concentration gradient is formed at the junction surface between the emitter and base regions so that it is possible to apply positive acceleration electric field for injecting carriers from the emitter region. Moreover, as the collector region surrounds the entire periphery of the emitter region it is possible to substantially increase the injection efficiency as well as the transport efficiency of the carriers. As a result, the lateral transistor has a high current amplification factor and an excellent high frequency characteristic. With regard to the vertical transistor, it is possible to make the impurity concentration of the emitter region to be higher than that of the base region and to make low the density of the recombination centers in the base region. Accordingly, the vertical transistor too has a high current amplification factor and an excellent high frequency characteristic. For this reason, the I²L semiconductor device has a low power delay product, a high fan out and ample noise margin.

What we claim is:

1. A method of manufacturing an integrated injection logic semiconductor device comprising the steps of forming a semiconductor layer of the opposite conductivity type on a semiconductor substrate of one conductivity type; forming an insulation film on said semiconductor layer of the opposite conductivity type; forming first and second openings through said insulation film; doping an impurity of said one conductivity type into said semiconductor layer of the opposite conductivity type through said first opening in a nonoxidizing atmosphere thereby forming a first one conductivity type region reaching said semiconductor substrate; doping an impurity into said first region of the first conductivity type and said semiconductor layer of the opposite conductivity type through said first and second openings in an oxidizing atmosphere thereby forming first and second opposite conductivity type regions completely within said first one conductivity type region and said semiconductor layer of the opposite conductivity type respectively; forming a third opening through said insulation film; and doping an impurity of said one conductivity type into said selected portion of the semiconductor layer of the opposite conductivity type through said third opening thereby forming a second one conductivity type region.

2. The method according to claim 1 wherein said first one conductivity type region is formed by the steps of applying a silicon nitride film on the portions of said semiconductor layer of the opposite conductivity type which are exposed through said first and second openings and on said insulation film, forming a first silicon oxide film incorporated with an impurity of said one conductivity type on said silicon nitride film; removing with an etching solution said silicon oxide film and said silicon nitride film except the portion of said silicon nitride film and the portion of said silicon oxide film confronting said second opening for exposing again said first opening, removing the remaining portion of said silicon oxide film with an etching solution; applying a second silicon oxide film incorporated with an impurity of said one conductivity type onto the surface portion of said silicon nitride film exposed as a result of the removal of said silicon oxide film, the surface portion of said semiconductor layer of the opposite conductivity typed exposed by said reexposed first opening and onto said insulation film, diffusing said impurity of the one conductivity type contained in said second silicon oxide film into said semiconductor layer of the opposite conductivity type through said first opening by treating the assembly thus obtained in a high temperature nonoxidizing atmosphere, and removing with an etching solution portions of said second silicon oxide film and said silicon nitride film for exposing again said first and second openings.

3. A method of manufacturing an integrated injection logic semiconductor device in a selected portion of a semiconductor layer comprising the steps of preparing a semiconductor substrate of one conductivity type; forming said semiconductor layer of the opposite conductivity type on said semiconductor substrate of one conductivity type; forming an insulation film on said selected portion of the semiconductor layer of the opposite conductivity type; forming first and second openings through said insulation film; selectively doping an impurity of the one conductivity type into said semiconductor layer of the opposite conductivity type through said first opening in a non-oxidizing atmosphere thereby forming a first region of said one conductivity type which reaches said semiconductor substrate; doping an impurity of the opposite conductivity type into said first region of the one conductivity type and into said semiconductor layer of opposite conductivity type respectively through said first and second openings in an oxidizing atmosphere thereby forming first and second regions of opposite conductivity type completely within said first region of the one conductivity type and said selected portion of the semiconductor layer of the opposite conductivity type respectively; forming a third opening through said insulation film; and doping an impurity of the one conductivity type into said selected portion of the semiconductor layer of the opposite conductivity type through said third opening in an oxidizing atmosphere thereby forming a second region of the one conductivity type in said semiconductor layer of the opposite conductivity type.

4. The method of manufacturing an integrated injection logic semiconductor device according to claim 3 wherein the doping step for forming said first region of the one conductivity type includes the steps of applying a silicon nitride film on the selected portions of said semiconductor layer of the opposite conductivity type which are exposed through said first and second openings and on said insulation film, forming a first silicon oxide film incorporated with an impurity of the one conductivity type on said silicon nitride film; removing with an etching solution said silicon oxide film and said silicon nitride film except the portion of said silicon nitride film and the portion of said silicon oxide film which overlies said second opening, thereby exposing said first opening; removing the remaining portion of said silicon oxide film with an etching solution; applying a second silicon oxide film incorporated with an impurity of the one conductivity type on said portion of said silicon nitride film exposed as a result of the removal of said silicon oxide film, on the portion of said semiconductor layer of the opposite conductivity type which is exposed by said first opening and on said insulation film; diffusing said impurity of the one conductivity type contained in said second silicon oxide film into said semiconductor layer of the opposite conductivity type through said first opening in a high temperature nonoxidizing atmosphere; and removing with an etching solution said second silicon oxide film and said silicon nitride film for exposing again said first and second openings through said insulation film.

5. The method of manufacturing an integrated injection logic semiconductor device according to claim 3 wherein said first opening is formed in an annular configuration and said second and third openings are formed within the area circumscribed by said first annular opening.

6. The method of manufacturing an integrated injection logic semiconductor device according to claim 3 wherein said first opening is formed in a grid shape thereby dividing said insulation film into a plurality of sections and said second and third openings are formed within each of said sections of said insulation film.

7. The method of manufacturing an integrated injection logic semiconductor device according to claim 3 which further includes the steps of reopening said first, second and third openings and forming electrode films on said first and second regions of the opposite conductivity type and on said second region of the one conductivity type region through the respective openings.

* * * * *